(12) United States Patent
Montorsi

(10) Patent No.: US 10,289,956 B2
(45) Date of Patent: May 14, 2019

(54) METHOD FOR UPDATING A FACTOR GRAPH OF AN A POSTERIORI PROBABILITY ESTIMATOR

(75) Inventor: Guido Montorsi, Turin (IT)

(73) Assignee: POLITECNICO DI TORINO, Turin (TO) (IT)

( * ) Notice: Subject to any disclaimer, the term of this patent is extended or adjusted under 35 U.S.C. 154(b) by 0 days.

(21) Appl. No.: 14/123,478

(22) PCT Filed: May 31, 2012

(86) PCT No.: PCT/IB2012/052754
§ 371 (c)(1),
(2), (4) Date: Dec. 2, 2013

(87) PCT Pub. No.: WO2012/164528
PCT Pub. Date: Dec. 6, 2012

(65) Prior Publication Data
US 2014/0108326 A1   Apr. 17, 2014

(30) Foreign Application Priority Data

May 31, 2011   (IT) .......................... TO2011A000477

(51) Int. Cl.
*G06N 7/00*   (2006.01)
*H03M 13/11*   (2006.01)

(52) U.S. Cl.
CPC ......... *G06N 7/005* (2013.01); *H03M 13/1117* (2013.01); *H03M 13/1171* (2013.01)

(58) Field of Classification Search
CPC .......... G06N 5/048; G06N 7/005; G06N 7/04; G06N 99/005; G06N 5/04

(Continued)

(56) References Cited

U.S. PATENT DOCUMENTS

| 7,475,014 B2 * | 1/2009 | Smaragdis ............ G10L 21/028 381/17 |
| 2006/0048038 A1 * | 3/2006 | Yedidia .................. H03M 7/30 714/793 |

(Continued)

FOREIGN PATENT DOCUMENTS

| EP | 2 144 413 A1 | 1/2010 |
| WO | 2009/044031 A1 | 4/2009 |

OTHER PUBLICATIONS

Danny Bickson—Gaussian Belief Propagation Theory and Application.*

(Continued)

*Primary Examiner* — Scott A. Waldron
*Assistant Examiner* — Viker A Lamardo
(74) *Attorney, Agent, or Firm* — Workman Nydegger

(57) ABSTRACT

A method for updating a factor graph (10;10';10") of an a posteriori probability estimator, the factor graph including at least one repetition node (13;13';13") and at least one sum node (11;11';11"), wherein at least two connections are associated with each node, and wherein each connection is associated with an incoming message at the node and with an outgoing message from the node, wherein the method includes the steps of: storing the nodes' incoming and outgoing messages into memory (12;12';12") of the estimator as messages belonging to one same class of wrapped and/or sampled Gaussian messages; updating the node of the factor graph (10;10';10") by using a resulting message belonging to the class of incoming messages, the resulting message being obtained by processing the incoming wrapped and/or sampled Gaussian messages.

10 Claims, 10 Drawing Sheets

(58) Field of Classification Search
USPC .......................................................... 706/52
See application file for complete search history.

(56) References Cited

U.S. PATENT DOCUMENTS

2009/0158128 A1* 6/2009 Yokokawa ............ H03M 13/15
714/780
2012/0173947 A1 7/2012 Voicila et al.

OTHER PUBLICATIONS

Drost et al.—Factor-Graph Algorithms for Equalization.*
Erik B. Sudderth—Graphical Models for Visual Object Recognition and Tracking.*
Gatto et al.—The generalized Von Mises distribution.*
Agiomyrgiannakiset al.—Wrapped Gaussian Mixture Models for Modeling and High-Rate Quantization of Phase Data of Speech.*
Kschischang et al.—Factor Graphs and the Sum-Product Algorithm.*
Sudderth et al.—Nonparametric Belief Propagation—http://ssg.mit.edu/nbp/papers/LIDS-TR2551.pdf (Year: 2002).*
Riccardo Gatto et al., *The Generalized Von Mises Distribution*, ScienceDirect, vol. 4, 2007, pp. 341-353.
Adrian Voicila et al., *Low-Complexity Decoding for Non-Binary LDPC Codes in High Order Fields*, IEEE Transaction on Communications, vol. 58, No. 5, May 2010, pp. 1365-1375.
International Search Report dated Aug. 24, 2012, issued in PCT Application No. PCT/IB2012/052754, filed May 31, 2012.
International Preliminary Report on Patentability dated Dec. 2, 2013, issued in PCT Application No. PCT/IB2012/052754, filed May 31, 2012.

* cited by examiner

METHOD FOR UPDATING A FACTOR GRAPH OF AN A POSTERIORI PROBABILITY ESTIMATOR

BACKGROUND OF THE INVENTION

1. Field of the Invention

The present invention relates to a method for updating a factor graph of an a posteriori probability estimator.

More in particular, the present invention relates to a method for updating a factor graph of an a posteriori probability estimator, wherein the repetition nodes, also called variable nodes or equality nodes, and the sum nodes, or parity check nodes, of the factor graph are updated with a message propagation algorithm.

The present invention further relates to an estimator, a decoder and a receiver implementing the method for updating a factor graph according to the invention.

2. Present State of the Art

Algorithms of the "Belief Propagation" type ("BP algorithms"), or message propagation algorithms, are known in the art.

In its most general form, the BP algorithm allows reconstructing the marginal probabilities for a set of random variables which describe a system and which are connected by local constraints, expressed as joint probability distributions P, by starting from a set of observations, in the form of messages or verisimilitudes L, on a subset thereof.

FIG. 1 illustrates a node of a factor graph 1 that represents a probability model, wherein the nodes 5 describe the local constraints, and the connections 3 between each node 5 describe the corresponding variables.

In the BP algorithm, each connection 3 to a node 5 is associated with an incoming message 7 $L(;I)$ and an outgoing message 9 $L(;O)$, and each node 5 of the factor graph 1 is replaced with a corresponding message update node.

The update rule for the node 5 is obtained by assuming statistic independence of the incoming messages 7, through a marginalization carried out in accordance with the formula (1.1):

$$L(x_j; O) \propto \sum_{\forall x_{\sim j}} P(x) \sum_{i \neq j}^{n} L(x_i; I) \forall j \qquad (1.1)$$

where $x=(x_1, \ldots, x_n)$ denotes a set of incoming variables at a node 5 and the symbol $x_{\sim j}$ denotes a subset of x obtained by excluding the variable $x_j$ from x.

The BP algorithm provides the exact a posteriori probabilities for all system variables in a finite number of steps when the graph is a tree (i.e. it contains no cycles), otherwise it gives a good approximation thereof.

As can be observed in the formula (1.1), the general complexity of the node update is proportional to the product of the cardinalities of the alphabets of the incoming symbols at the node 5.

Furthermore, the messages 7,9 are represented by a function of the incoming symbols, and therefore they require, in order to be stored, a memory which is proportional to the cardinality of the symbol alphabets.

A particularly important example of application of the BP algorithm is obtained when the underlying model is a linear system.

In a linear system, the random variables are obtained as a linear combination of other random variables.

For linear systems, the factor graph 1 is made up of three types of nodes 5:
- sum nodes: the sum of the incoming variables at a node 5 is equal to zero;
- repetition nodes (also called variable nodes or equality nodes): two or more variables are equal;
- scaling: the output is a scaled version of the input.

In this case, the rules for updating the messages at the nodes correspond, respectively, to convolution, multiplication and scaling of the axes of the messages 7,9. In order to emphasize the properties of these update rules, the following notations will be adopted below for the operations between messages 7,9:

$$L_1 + L_2 \triangleq L_1(x) * L_2(x)$$

$$\alpha L \triangleq L_1(\alpha x)$$

$$L_1 \cdot L_2 \triangleq L_1(x) \cdot L_2(x)$$

where $L_1$ and $L_2$ are a first and a second messages relating to two input variables at a node 5, the symbol "*" indicates the convolution operator, and the symbol "$\triangleq$" indicates a definition.

Since convolution and product operations are associative, the update operation for a node 5 that involves more than three variables can be carried out by repeatedly applying the corresponding operations in the formula (1.2):

$$\text{sum node: } L(x_j; O) = -\sum_{i \neq j}^{n} L(x_i; I)$$

$$\text{repetition node: } L(x_j; O) = \prod_{i \neq j}^{n} L(x_i; I)$$

It can be observed that the sign inversion simply corresponds to the overturning of the axis of the messages: $-L_1(x) \triangleq L_1(-x)$.

The complexity of the BP algorithm in this case increases linearly with the number of variables involved in the node 5. In general, it can be shown that, in order to update all the messages for a sum node or repetition node involving n variables, it is sufficient to carry out $3 \cdot (n-2)$ corresponding binary update operations (convolution or multiplication among messages).

The incoming and outgoing messages in the BP algorithm are normally vectors whose size is equal to the cardinality of the alphabet of the respective variable.

In the following, the term message class will refer to a subset of messages which can be parameterized with a number of parameters smaller than the dimensionality of the cardinality of the associated variable. In a BP algorithm operating on linear systems and continuous variables, it is not guaranteed that the output messages belong to the same class as that of the input messages, with the important exception of the Gaussian message class.

The class of Gaussian (also referred to as Normal) messages, or G-messages, is defined as follows:

$$\mathcal{G} \triangleq \left\{ G(\mu, K) \propto e^{-\frac{K}{2}|x-\mu|^2}, K \in \mathbb{R}^+, \mu \in \mathbb{R} \right\} \quad (1.3)$$

where the two parameters K (called "concentration", equal to the inverse of variance) and μ (mean) univocally define a member of the Gaussian message class.

G-messages form a closed set with respect to the convolution, product and scaling of the axes. In addition, the message update rules (convolution and product) translate into rules for updating the parameters of the class of G-messages as follows and as shown in FIG. 2:

$$G_1 + G_2 = G_3 = G(\mu_1 + \mu_2, (K_1^{-1} + K_2^{-1})^{-1}) \quad (1.4)$$

$$G_1 \cdot G_2 = G_3 = G\left(\frac{\mu_1 K_1 + \mu_2 K_2}{K_1 + K_2}, K_1 + K_2\right) \quad (1.5)$$

$$\alpha G = G\left(\alpha\mu, \frac{K}{\alpha^2}\right). \quad (1.6)$$

The simplification found in the formulas (1.4), (1.5) and (1.6) allows the BP algorithm to be executed on factor graphs 1 with finite complexity because:
- the messages 7,9 are only stored through the two parameters (concentration and mean) that identify the member of the Gaussian message class according to the formula (1.3): otherwise, the message 7,9 would be a function of the continuous variable x, and therefore would require infinite memory in order to be stored;
- the update operations are only executed on the parameters of the Gaussian message class by using the formulas (1.4), (1.5) or (1.6): in this case as well, the complexity of the convolution and multiplication operations would be infinite for generic messages 7,9.

For further details about the derivation of update rules for linear factor graphs with Gaussian messages, see for example the article by Loeliger H.-A., Dauwels J., Junli Hu, Korl S., Li Ping, Kschischang F. R.: "The Factor Graph Approach to Model-Based Signal Processing", Proceedings of the IEEE, vol. 95, no. 6, pp. 1295-1322, June 2007, while European patent application no. EP 2144413 illustrates an application of the algorithm described in the cited article for carrying out channel estimate in numerical receivers.

On the other hand, when the system variables are discrete and/or limited, i.e. when discrete alphabets are used, the complexity and memory requirement for message representation of the existing algorithms grow at least linearly with the cardinality of the message alphabets.

The BP algorithm thus becomes inefficient for high-cardinality finite alphabets.

A technical field where BP algorithms are used is channel coding with the introduction of iterative algorithms for decoding very large random codes.

Very large random codes with binary alphabets allow reaching performance levels close to the theoretical limit, but the complexity of their optimal decoding grows exponentially with the code size.

Instead, the complexity of the BP algorithm grows only linearly with the number of variables involved, and therefore ensures very good performance with reasonable complexity.

The use of discrete but not binary variables (cardinality M) at the encoder is desirable for several reasons.

Encoders with high spectral efficiency, which map sets of m=log$_2$ M bits coded on high-cardinality constellations of the QAM or PAM type are often used in telecommunication standards.

For this type of applications, non-binary encoders are the natural choice, and provide better performance than binary codes. However, non-binary encoders are not often employed in practice, mainly because the BP algorithm has a complexity which is at least linear with M and therefore exponential with m.

For this reason, considerable efforts have been made in the telecommunications industry to reduce the complexity of the BP algorithm for non-binary codes, but the best algorithm known (based on FFT) has a complexity of the order of O(M log M) and a memory requirement proportional to M.

For example, the article by Voicila A., Declercq D., Verdier F., Fossorier M., Urard P., entitled "Low-complexity decoding for non-binary LDPC codes in high order fields", IEEE Transactions on Communications, vol. 58, no. 5, pp. 1365-1375, May 2010, describes an algorithm, called EMS (Extended Min Sum), which further reduces this complexity, at the price however of a degradation in the performance of the decoder, while European patent application no. EP2198523 represents an application of the method proposed in said article wherein, in order to execute the BP algorithm, messages in the form of vectors are used and the update rules are obtained by simplifying the convolution operations.

SUMMARY OF THE INVENTION

It is one object of the present invention to provide a method for updating a factor graph of an a posteriori probability estimator which requires a certain quantity of memory for message representation which is independent of the size of the alphabets in use.

It is another object of the present invention to provide a method for updating a factor graph of an a posteriori probability estimator which allows acting upon messages relating to limited and/or discrete variables.

It is a further object of the present invention to provide a method for updating a factor graph of an a posteriori probability estimator which is applicable for iterative decoding of a non-binary code with high or very high cardinality.

These and other objects of the invention are achieved through a method for updating a factor graph of an a posteriori probability estimator as claimed in the appended claims, which are an integral part of the present description.

The invention also relates to an estimator, a decoder and a receiver implementing the method of the present invention.

In short, the subject of the present invention is a method for updating a factor graph of an a posteriori probability estimator, wherein Gaussian like messages are used at the sum and repetition nodes, and wherein discrete and/or limited variables are employed.

The messages are parameterized with their mean and concentration, and the graph update operations have a complexity which does not depend on the cardinality of the alphabets of the variables involved at the nodes.

Therefore, the messages are not represented as vectors whose length is equal to the cardinality of the associated variable, but through a few parameters which identify them within the predefined class. This approach makes both the computational complexity and the memory requirements of the algorithm independent of the cardinality of the variables associated with the graph.

Furthermore, the method according to the present invention allows to provide iterative decoders for non-binary linear channel encoders over rings, with a computational complexity and a memory requirement independent of the dimension of the alphabets in use, thereby allowing for the creation of decoders offering performance levels close to the theoretical limit even for very high spectral efficiencies (tens or hundreds of bits per transmitted symbol), which cannot be obtained with any other prior art algorithm.

In one embodiment of the invention, the class of D-messages is introduced, i.e. messages wherein the message variables are discrete and limited. Said D-messages have low processing complexity and require a small quantity of memory for storage, because the parameterization thereof is independent of alphabet cardinality. D-messages thus open the way to intensive application of non-binary codes with high or even very high cardinality in the telecommunications field.

Further features of the invention are set out in the appended claims, which are intended to be an integral part of the present description.

BRIEF DESCRIPTION OF THE DRAWINGS

The above objects will become more apparent from the following detailed description of a method for updating a factor graph of an a posteriori probability estimator, with particular reference to the annexed drawings, wherein.

DETAILED DESCRIPTION OF THE PREFERRED EMBODIMENTS

Figure 1:
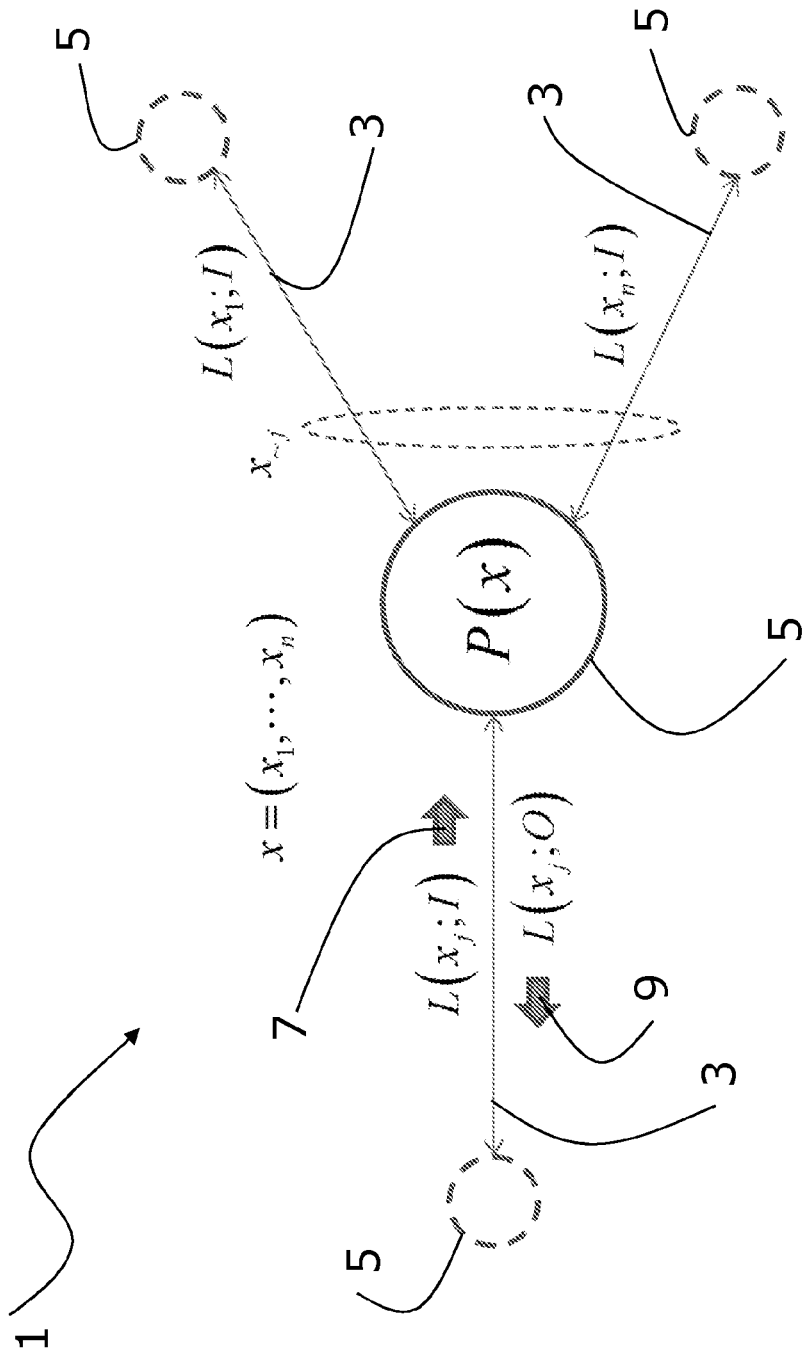
FIG. 1 shows a node of a prior art factor graph representing a probabilistic model.
Figure 2:
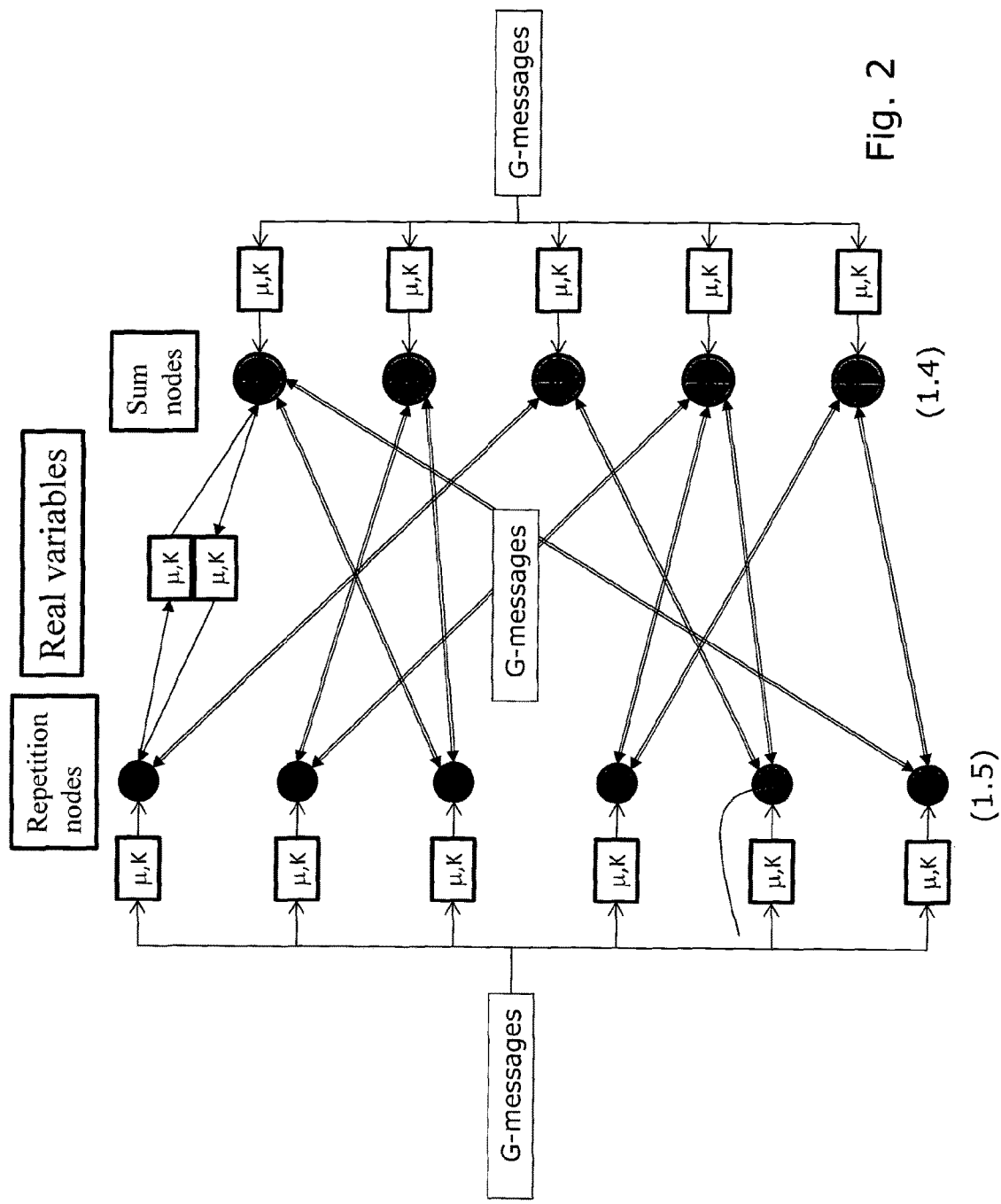
FIG. 2 shows a factor graph wherein Gaussian messages are exchanged in accordance with the prior art.
Figure 3:
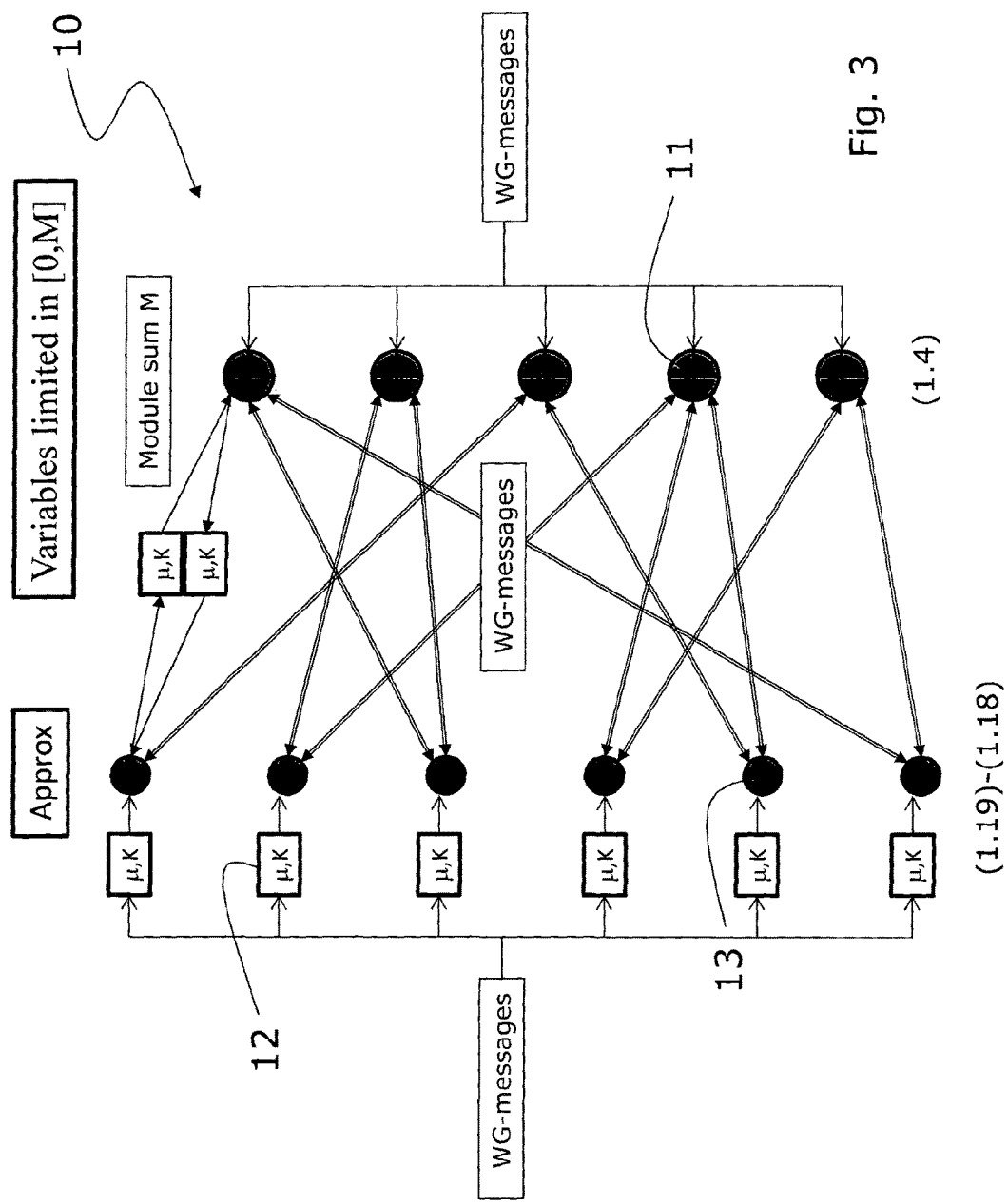
FIG. 3 shows a factor graph wherein wrapped messages are exchanged in accordance with a first embodiment of the method of the present invention.

With reference to FIG. 3, there is shown a factor graph 10 of an estimator that comprises memory means 12 adapted to store incoming and outgoing messages at sum nodes 11 and repetition nodes 13 of the factor graph 10.

In a first embodiment of the method according to the invention, the operation "modulo M", where $M \in \mathbb{R}$, is carried out on the variables a at the output of the sum nodes 11 of the factor graph 10, i.e. new variables $a_w = a \bmod M$ are taken into account.

The module operation carried out on the output variables induces a wrapping of the corresponding messages $L_a$.

The messages $L_{a_w}(x)$ of the variables $a_w$ are obtained from those relating to the variables a as follows:

$$L_{a_w}(x) = \sum_i L_a(x - iM) = s_M(x) * L_a(x) \triangleq W[L_a(x)], \quad (1.7)$$

where the pulse train $$s_M(x) \triangleq \sum_{i=-\infty}^{\infty} \delta(x - iM)$$

and a wrapping operator W[.] are introduced.

The wrapping of the messages is transparent with respect to the sum operation, because the operator W switches with the convolution product:

$$W[L_1] + W[L_2] = W[L_1 + L_2]$$

In particular, this introduces the class of wrapped Gaussian messages (WG-messages), also referred to as wrapped normal messages, which is defined by applying the wrapping operator W to the G-messages of the formula (1.3):

$$\mathcal{W} = W[\mathcal{G}] = \{W[G(\mu, K, x)], K \in \mathbb{R}^+, \mu \in [0, M]\}$$

This class is still parameterized with the concentration and mean (module M) of the corresponding G-messages.

The class $\mathcal{W}$ of WG-messages is closed with respect to the sum operation:

$$W[G_1] + W[G_2] = W[G_1 + G_2] = W[G_3] \in \mathcal{W}. \quad (1.8)$$

On the other hand, the wrapping has a non-transparent effect at the repetition nodes, since in general it does not switch with multiplication:

$$W[L_1] \cdot W[L_2] \neq W[L_1 \cdot L_2] \quad (1.9)$$

This effect is due to the fact that, when the original messages do not have support strictly limited in [0,M], the replicas, or copies, induced by the wrapping of the message are superimposed (aliasing effect):

$$\sum_j L_1(x - jM) \sum_i L_2(x - iM) = \qquad (1.10)$$

$$\sum_j L_1(x - jM) L_2(x - jM) + \underbrace{\sum_{i \neq j} L_1(x - jM) L_2(x - iM)}_{aliasing}$$

In particular, the class of WG-messages is no longer closed for this operation, because G-messages do not have limited support in the interval [0,M]:

$$W[G_1] \cdot W[G_2] \notin \mathcal{W} \quad (1.11)$$

In order to execute a BP algorithm to update the parameters of the class of WG-messages, it is therefore appropriate to find an approximation of the product of (1.11) in the class $\mathcal{W}$ of WG-messages.

To this end, the class of Von Mises messages (V-messages) is taken into account:

$$\mathcal{V} \triangleq \{V(\mu, K_v) \propto e^{K_v \cos(A(x-\mu))}, K_v \in \mathbb{R}^+[0, M]\} \quad (1.12)$$

where $K_v$ is the concentration and $\mu$ is the mean of the V-message, and where the quantity $$A \triangleq \frac{2\pi}{M}$$

is defined.

The class of V-messages is closed with respect to the product $$\forall V_1, V_2 \in \mathcal{V}, V_1 \cdot V_2 = V_3 \in \mathcal{V} \quad (1.13)$$

The parameters of the output V-message $V_3$ can be obtained as follows:

$$\mu_3 = \frac{1}{A} \arctan\left(\frac{K_{v,1}\sin(A\mu_1) + K_{v,2}\sin(A\mu_2)}{K_{v,1}\cos(A\mu_1) + K_{v,2}\cos(A\mu_2)}\right) \quad (1.14)$$

$$K_{v,3} = \sqrt{K_{v,1}^2 + K_{v,2}^2 + 2K_{v,1}K_{v,2}\cos(A(\mu_1 - \mu_2))}.$$

It is also possible to approximate a member of the class of WG-messages with mean $\mu$ with a member of the class of V-messages with the same mean by applying the following transformations between the respective concentrations, as known, for example, from the book written by Evans M, Hastings N. and Peacock B.: "Von Mises Distribution", chapter 41, Statistical Distributions, third edition, New York, Wiley, 2000:

$$W[G(\mu, K_w)] \approx V(\mu, K_v) \quad (1.15)$$

$$K_w = A^2\left(2\log\left(\frac{I_0(K_v)}{I_1(K_v)}\right)\right)^{-1} \triangleq A^2 f(K_v)$$

$$V(\mu, K_v) \approx W[G(\mu, K_w)] \quad (1.16)$$

$$K_v = f^{-1}\left(\frac{K_w}{A^2}\right)$$

where the function $f(\bullet)$ has been defined in order to make the formula simpler, and where $K_v$ and $K_w$ are, respectively, the concentrations of a V-message and of a WG-message approximating it.

In the formula (1.15), moreover, $I_i(x)$ indicates the modified Bessel functions of order i.

In order to find a member of the class $\mathcal{W}$ of WG-messages which approximates the formula (1.11), it is therefore necessary to:
approximate the two WG-messages of the formula (1.11) with two V-messages by using the formula (1.16);
calculate the product between the two V-messages with the formula (1.14) and approximate again the resulting V-message with a WG-message by using the formula (1.15).

In brief $$W[G_1]W[G_2] \approx W[G_3] \quad (1.17)$$
where
$$K_{v,i} \triangleq f^{-1}(K_{w,i}/A^2)$$
$$i = 1, 2$$

$$\mu_3 = \frac{1}{A}\arctan\left(\frac{K_{v,1}\sin(A\mu_1) + K_{v,2}\sin(A\mu_2)}{K_{v,1}\cos(A\mu_1) + K_{v,2}\cos(A\mu_2)}\right) \quad (1.18)$$

$$K_{w,3} = A^2 f\left(\sqrt{K_{v,1}^2 + K_{v,2}^2 + 2K_{v,1}K_{v,2}\cos(A(\mu_1 - \mu_2))}\right).$$

The approximation of the formula (1.18) is preferably made when the aliasing effect induced by the wrapping of the formula (1.10) is not negligible, i.e. when the concentration of either message is not sufficiently small, i.e. it is above a threshold that needs to be optimized depending on the specific application. Otherwise, one may directly use the repetition node update formula (1.5) for non-wrapped variables:

$$W[G_1] \cdot W[G_2] \approx W\left[G\left(\frac{\bar{\mu}_1 K_1 + \bar{\mu}_2 K_2}{K_1 + K_2} \mid \mod M, K_1, K_2\right)\right] \quad (1.19)$$

where the two means $\bar{\mu}_1, \bar{\mu}_2$ in the formula (1.19) must be chosen, in this case, among all the replicas (or copies) introduced by the wrapping, so that the distance is minimal. In other terms, $\bar{\mu}_1 = \mu_1 + k_1 M$ and $\bar{\mu}_1 = \mu_2 + k_2 M$ and the integers $k_1$, $k_2$ are such that $|\bar{\mu}_1 - \bar{\mu}_2|$ is minimum.

The following will describe a second embodiment of the method according to the invention, wherein the system variables are assumed to be discrete, i.e. $x \in \mathbb{Z} \subset \mathbb{R}$.

Figure 4:
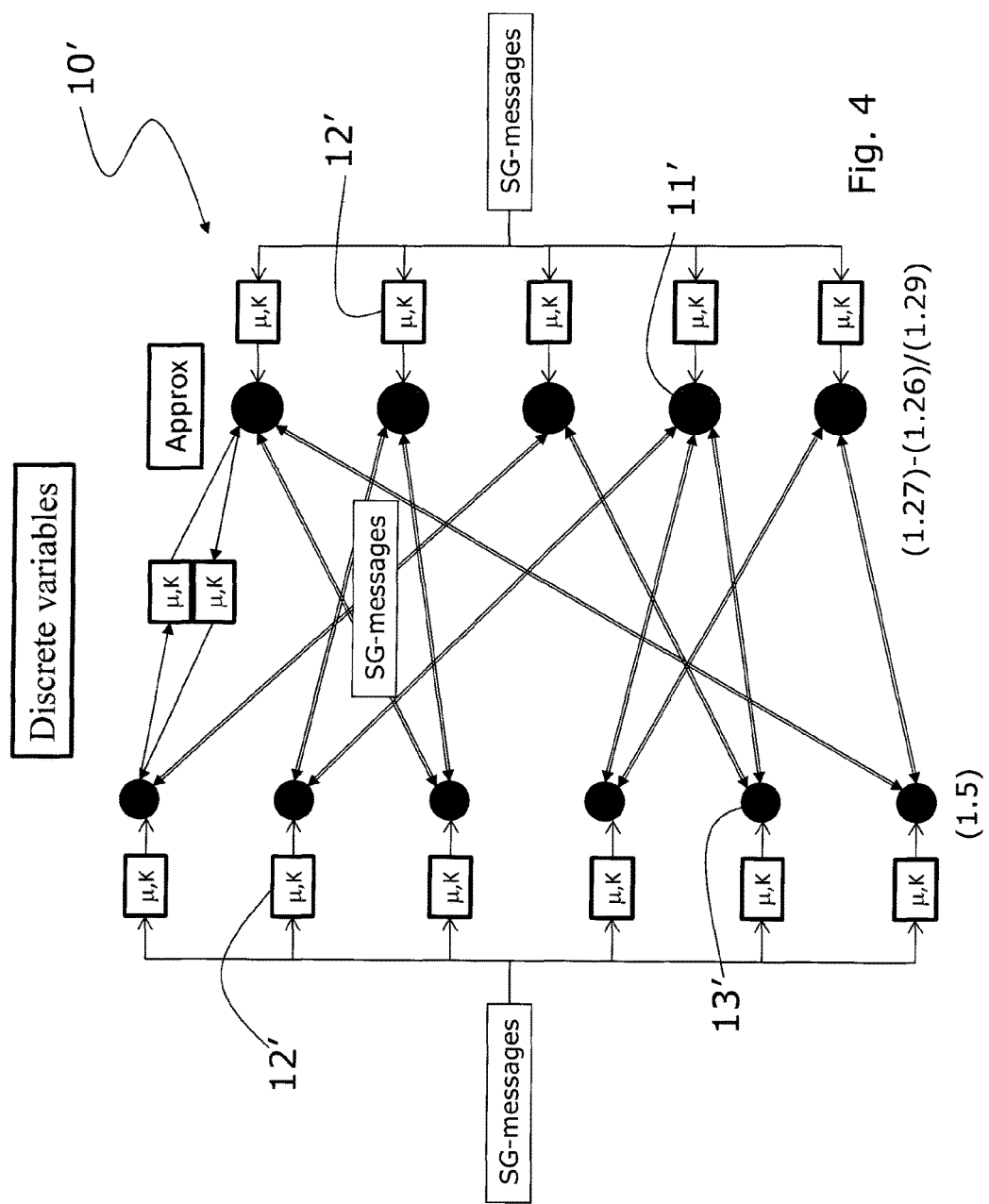
FIG. 4 shows a factor graph wherein sampled messages are exchanged in accordance with a second embodiment of the method of the present invention.

With reference to FIG. 4, there is shown a factor graph 10' of an estimator that comprises memory means 12' adapted to store incoming and outgoing messages at sum nodes 11' and repetition nodes 13' of the factor graph 10'.

This a priori knowledge can be imposed in the BP algorithm by sampling the corresponding messages, which operation corresponds to multiplying an incoming message at a node 11',13' by a pulse train $s_1(x)$:

$$S[L(x)] \triangleq s_1(x) \cdot L(x) \quad (1.20)$$

where the sampling operator $S[\bullet]$ has been introduced.

The behaviour of the sampling operator $S[\bullet]$ with respect to the operations at the nodes 11',13' of the graph 10' of a linear system is complementary to that of the wrapping operator $W[\bullet]$ of the first embodiment of the method according to the present invention.

The sampling of the messages is, in fact, transparent to the update of the repetition nodes 13', but it is not with respect to the sum nodes 11':

$$S[L_1] \cdot S[L_2] = S[L_1 \cdot L_2]$$

$$S[L_1] + S[L_2] \neq S[L_1 + L_2] \quad (1.21)$$

The class of sampled Gaussian messages (SG-messages) is thus introduced, which is obtained by applying the sampling operator $S[\bullet]$ to G-messages.

The class $\triangleq S[g]$ of sampled Gaussian messages is closed with respect to the product, but it is not with respect to the convolution:

$$S[G_1] \cdot S[G_2] = S[G_1 \cdot G_2] = S[G_3] \quad (1.22)$$

$$S[G_1] * S[G_2] * S[G_3] \quad (1.23)$$

In this case, in order to be able to proceed in the BP algorithm by only using the parameters of the SG-messages, it is necessary to find an approximation of the formula (1.23) in the class of SG-messages.

In order to proceed, one must take into consideration that:
the convolution product of SG-messages corresponds to the product of their characteristic functions;

$$\mathcal{F}\{S[G_1] * S[G_2]\} = \mathcal{F}\{S[G_1]\} \cdot \mathcal{F}\{S[G_2]\} \quad (1.24)$$

the characteristic functions of SG-messages are WG-messages with a purely imaginary mean value and a unitary period multiplied by a complex exponential;

$$\mathcal{F}\{S[G(\mu, K, x)]\} \propto \sum_{n=-\infty}^{\infty} e^{-\frac{2\pi^2}{K}(p-n)^2 - j2\pi(l+\alpha)(p-n)} \propto$$

$$e^{-j2\pi l p} W\left[G\left(-j\frac{K\alpha}{2\pi}, \frac{4\pi^2}{K}, p\right)\right] \quad (5)$$

where the following has been defined:

$$l \triangleq [\mu] \in \mathbb{Z} \text{ integer closest to } \mu$$

$$\alpha \triangleq \mu - l \in [-0.5, 0.5]$$

the approximations of the formulas (1.15) and (1.16) between members of the class of V-messages and those of the class of WG-messages are also valid when the WG-messages have an imaginary mean value;

$$W\left[G\left(p, -j\frac{K_{w,i}\alpha_i}{2\pi}, \frac{4\pi^2}{K_{w,i}}\right)\right] \approx V\left(p, -j\frac{K_{w,i}\alpha_i}{2\pi}, f^{-1}\left(\frac{1}{K_{w,i}}\right)\right).$$

the product of V-messages with imaginary mean value is still closed, and the transformations that must be carried out in order to obtain the parameters of the output V-message are obtained from the formula (1.14) by transforming the trigonometric functions with purely imaginary argument into suitable hyperbolic functions, $$V\left(x, -j\frac{\mu_1}{2\pi}, K_{v,1}\right)V\left(x, -j\frac{\mu_2}{2\pi}, K_{v,2}\right) = V\left(x, -j\frac{\mu_3}{2\pi}, K_{v,3}\right) \quad (1.25)$$

$$\mu_3 = \frac{1}{2}\log\frac{K_{v,1}e^{\mu_1} + K_{v,2}e^{\mu_2}}{K_{v,1}e^{-\mu_1} + K_{v,2}e^{-\mu_2}}$$

$$K_{v,3} = \sqrt{K_{v,1}^2 + K_{v,1}^2 + 2K_{v,2}K_{v,2}\cosh(\mu_1 - \mu_2)}$$

where the formula (1.25) has been obtained by using the identity $$\operatorname{arctanh}(x) = \frac{1}{2}\log\left(\frac{1+x}{1-x}\right)$$

On these grounds, the approximation of the formula (1.23) can be done through the following steps:
approximating the characteristic functions of the two SG-messages (WG-messages with imaginary mean value and concentrations proportional to the inverse of the original concentrations) with V-messages;
calculating the product between said V-messages with imaginary mean value by using the formula (1.25);
approximating the result with a WG-message that represents the characteristic function of the SG-message which approximates the formula (1.23).
In brief $$S[G_1] + S[G_2] \approx S[G_3] \quad (1.26)$$

where $$K_{v,i} = f^{-1}(1/K_{w,i})$$

$$\mu_i = (l_i + \alpha_i)$$

-continued $$\gamma_i = \alpha_i K_{w,i}$$

$$\gamma_3 = \frac{1}{2}\log\frac{K_{v,1}e^{\gamma_1} + K_{v,2}e^{\gamma_2}}{K_{v,1}e^{-\gamma_1} + K_{v,2}e^{-\gamma_2}}$$

$$l_3 = l_1 + l_2$$

$$K_{w,3} = 1 / f\left(\sqrt{K_{v,1}^2 + K_{v,1}^2 + 2K_{v,2}K_{v,2}\cosh(\gamma_1 - \gamma_2)}\right)$$

Figure 5:
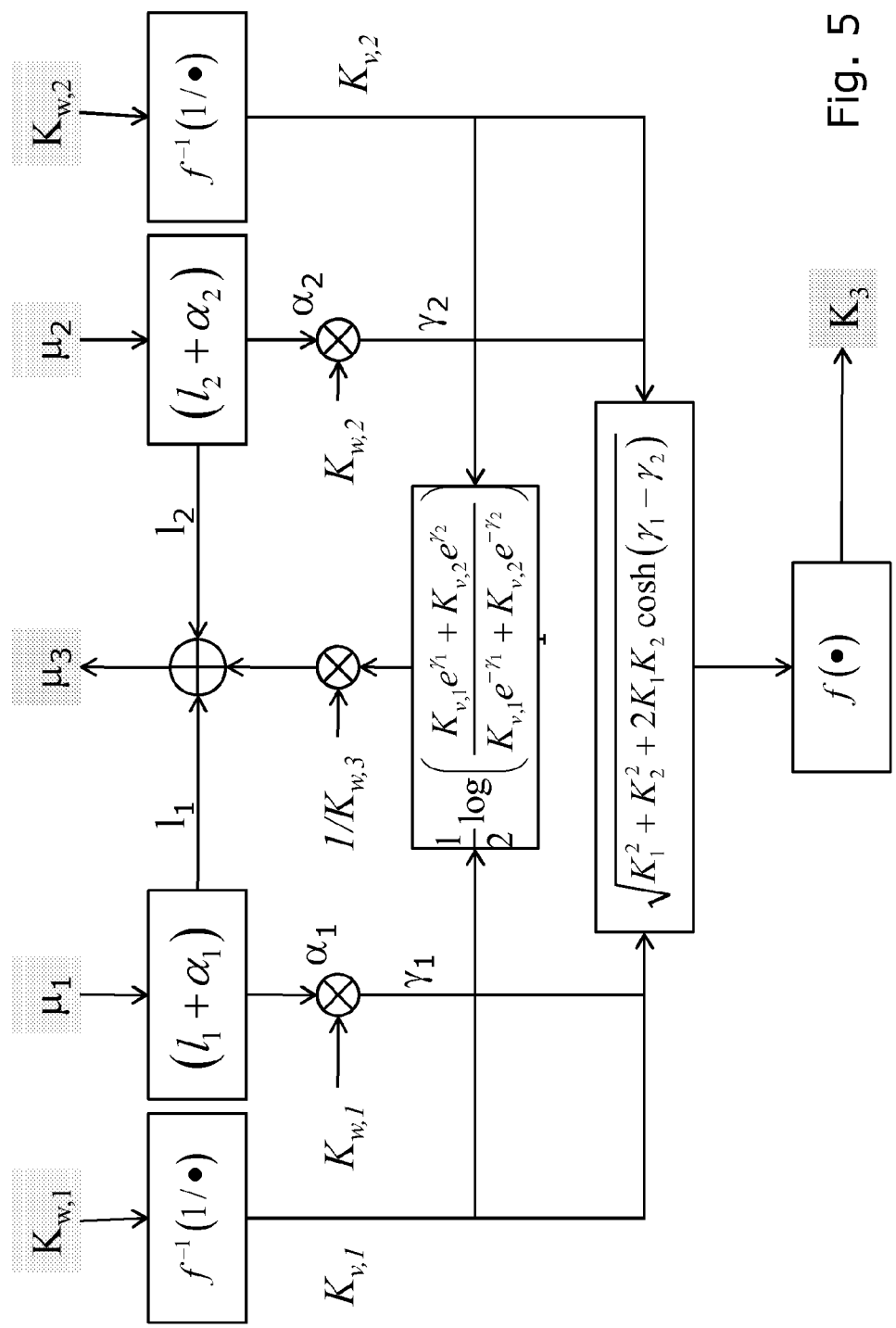
FIGS. 5 and 6 show respective block diagrams illustrating the blocks and operations required for updating the messages at the sum nodes in accordance with a first and a second variants of said second embodiment.

FIG. 5 shows a block diagram which illustrates the operations that must be carried out in order to obtain the formula (1.26).

The formula (1.26) should preferably be used when the concentration of the characteristic functions of the messages is sufficiently high, i.e. above a threshold that must be optimized for each specific application, and therefore for small message concentration values. Otherwise, the update formula becomes the formula (1.4):

$$S[G_1] + S[G_2] \approx S\left[G(\mu_1 + \mu_2, (K_{w,1}^{-1} + K_{w,2}^{-1})^{-1})\right] \quad (1.27)$$

When concentration values are small, the correspondence between the concentrations of V-messages and the concentrations of WG-messages of the formula (1.16) takes a logarithmic trend. The following approximations apply:

$$f(x) \approx -\frac{1}{2\log(x/2)}, \quad (1.28)$$

$$x < 1$$

$$f^{-1}(x) \approx 2e^{-\frac{1}{2x}},$$

$$x < 0.72$$

It is therefore advantageous to introduce the concentration logarithm $\kappa_{v,i} \triangleq \log K_{v,i} - \log(2)$ for V-messages and to derive the update equations (1.26) by using this quantity.

By introducing the associative operator $\max^* \triangleq \log \Sigma \exp$ to simplify the notations, the update equations can be re-written as follows:

$$\kappa_{v,i} = -K_{w,i}/2 \quad (1.29)$$

$$\mu_i = (l_i + \alpha_i)$$

$$\gamma_i = \alpha_i K_{w,i}$$

$$K_{w,3} = -\max^*(2\kappa_{v,1} + 2\kappa_{v,1}, \kappa_{v,1} + \kappa_{v,2} + \max^*(\gamma_1 - \gamma_2, \gamma_2 - \gamma_1))$$

$$\gamma_3 = \frac{1}{2}(\max^*(\kappa_{v,1} + \gamma_1, \kappa_{v,2} + \gamma_2) - \max^*(\kappa_{v,1} - \gamma_1, \kappa_{v,2} - \gamma_2))$$

This update operation, which is equivalent to the formula (1.26), only requires sums and max* operators, and is therefore particularly useful when implementing the method of the present invention.

Figure 6:
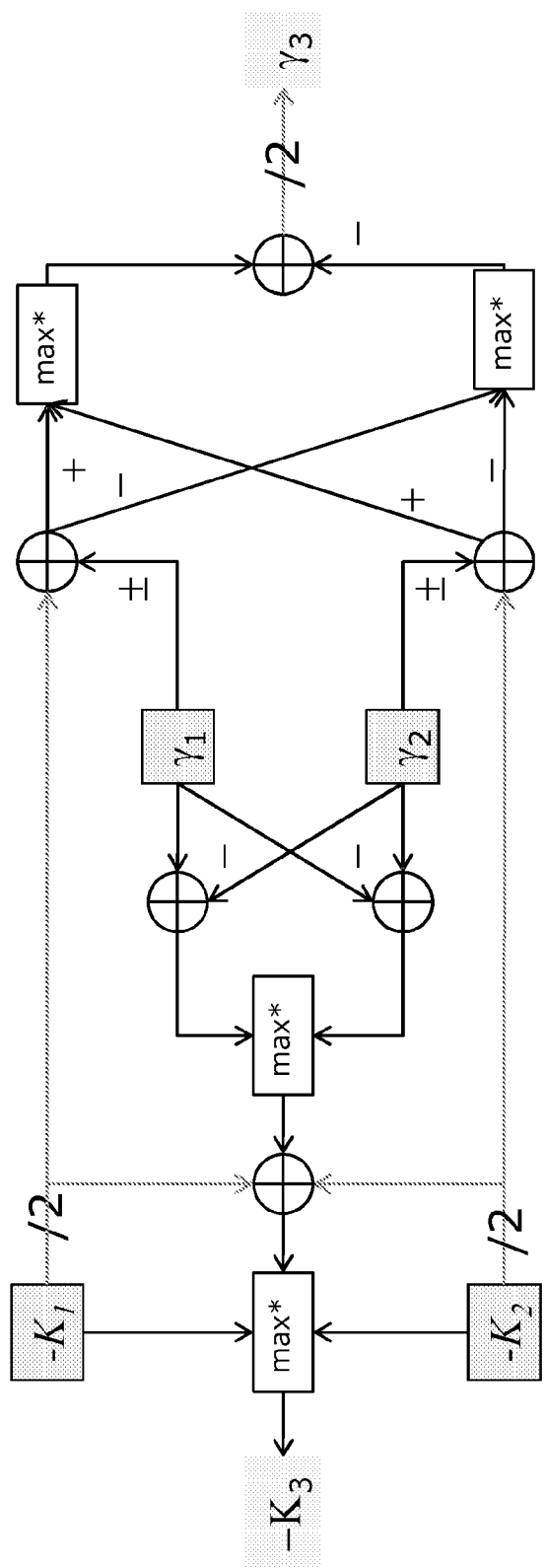

FIG. 6 shows a block diagram which illustrates the operations required for obtaining the formula (1.29).

The following will describe a third embodiment of the method according to the invention, wherein variables are made discrete and are wrapped with integer period M.

Figure 7:
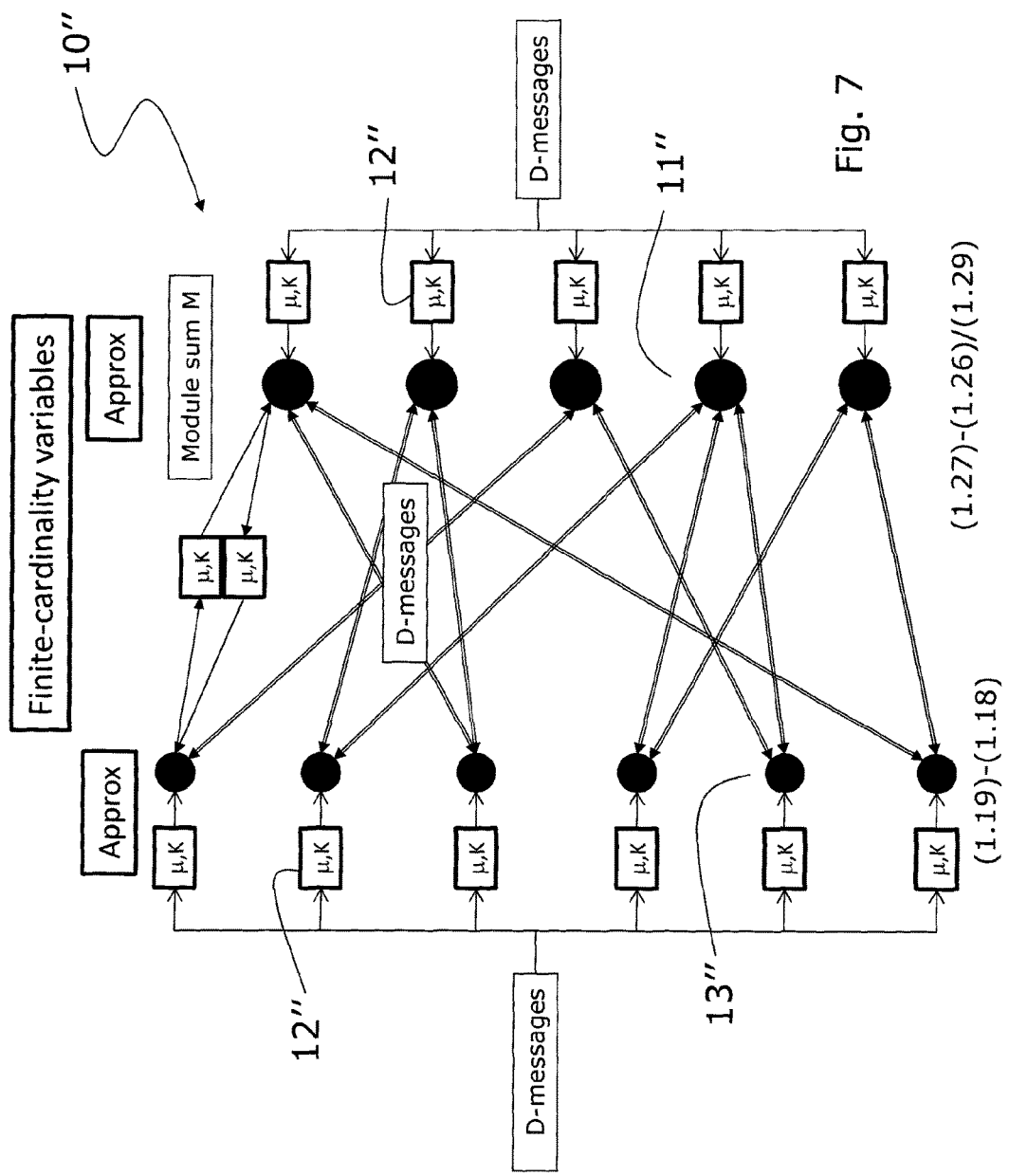
FIG. 7 shows a factor graph wherein sampled and wrapped messages are exchanged in accordance with a third embodiment of the method of the present invention.

With reference to FIG. 7, there is shown a factor graph 10" of an estimator that comprises memory means 12" adapted to store incoming and outgoing messages at sum nodes 11" and repetition nodes 13" of the factor graph 10".

In this third embodiment, the sampling operators S[•] and the wrapping operators W[•] switch, and it is possible to introduce the class of digital messages (D-messages)

$$\mathcal{D} \triangleq S[W[\mathcal{G}]] = W[S[\mathcal{G}]]$$

which can still be parameterized through the mean and the variance of the corresponding Gaussian message.

Figure 8:
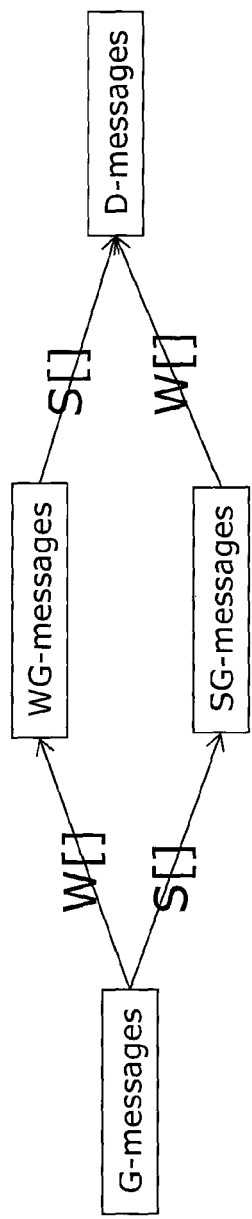
FIG. 8 shows a relation between Gaussian messages, wrapped messages, sampled messages, and sampled and wrapped messages.

The relation among WG-messages, SG-messages and D-messages is shown in FIG. 8.

The class of D-messages is not closed either with respect to the sum nodes 11" or with respect to the repetition nodes 13". However, it is still possible to apply the approximations introduced with reference to WG-messages and SG-messages:

$$W[S[G_1]] + W[S[G_2]] = W[S[G_1] + S[G_2]] \approx W[S[G_3]] \quad (1.30)$$

$$S[W[G_1]] \cdot S[W[G_2]] = S[W[G_1] \cdot W[G_2]] \approx S[W[G_3]] \quad (1.31)$$

Discrete variables wrapped with integer period M are variables with finite cardinality M which are obtained, for example, in linear encoders over rings, where inputs are discrete variables in [0,M−1] and sums are made with module M. Said class of linear encoders is a generalization of binary codes (M=2).

The method of said third embodiment, which uses D-messages, thus allows for iterative decoding of linear codes over rings. It should be pointed out, however, that the variable scaling operation (product by a scalar) is not possible.

The complexity of the corresponding iterative decoder is therefore independent of M.

Figure 9:
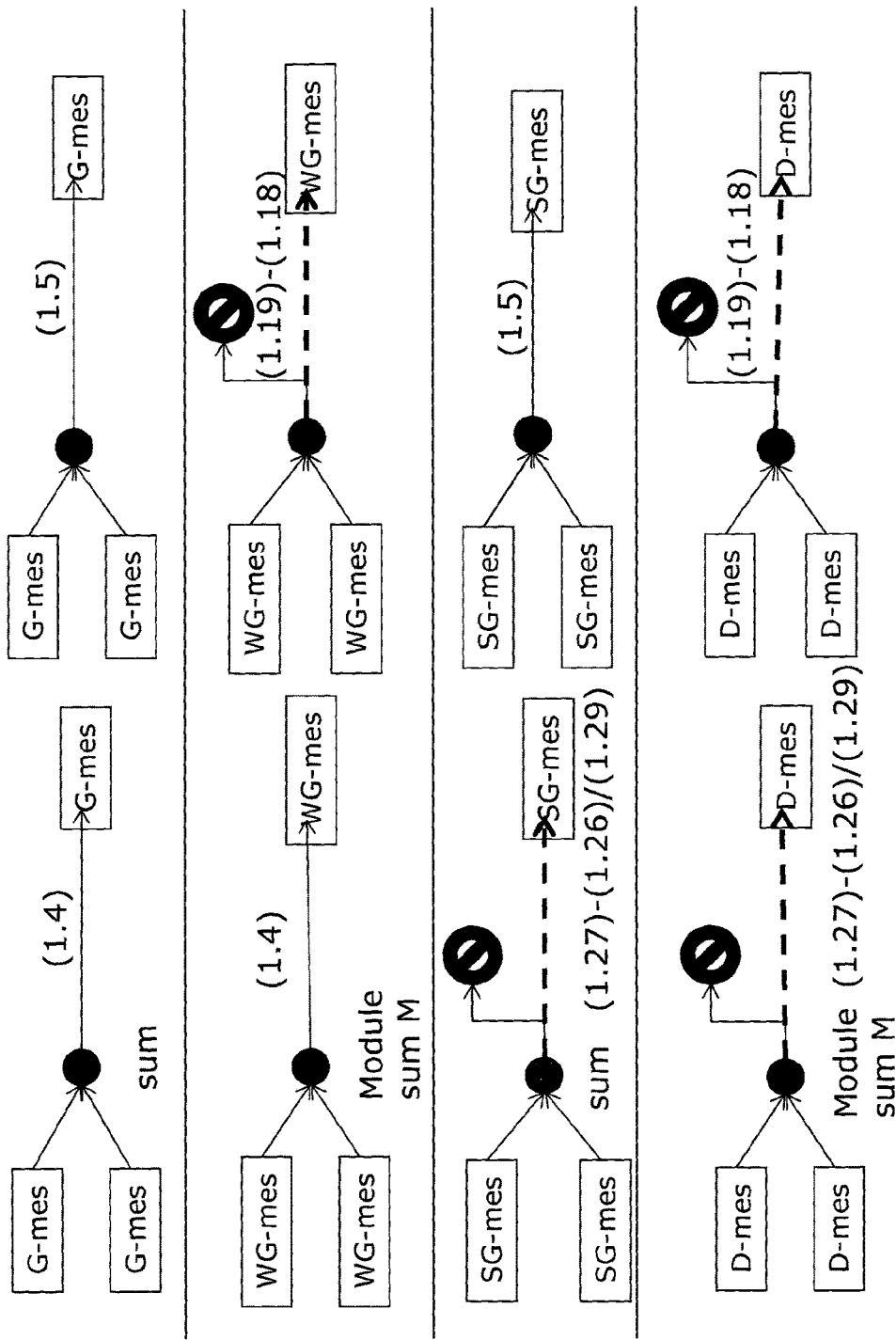
FIG. 9 shows a table that summarizes the formulas that can be used in accordance with the method of the present invention for wrapped messages, sampled messages, and sampled and wrapped messages.

An overview of the formulas that can be used in accordance with the method of the present invention for WG, SG and D type messages is shown in FIG. 9.

The decoder implementing the method according to one of the three above-described embodiments of the invention comprises an estimator.

Figure 10:
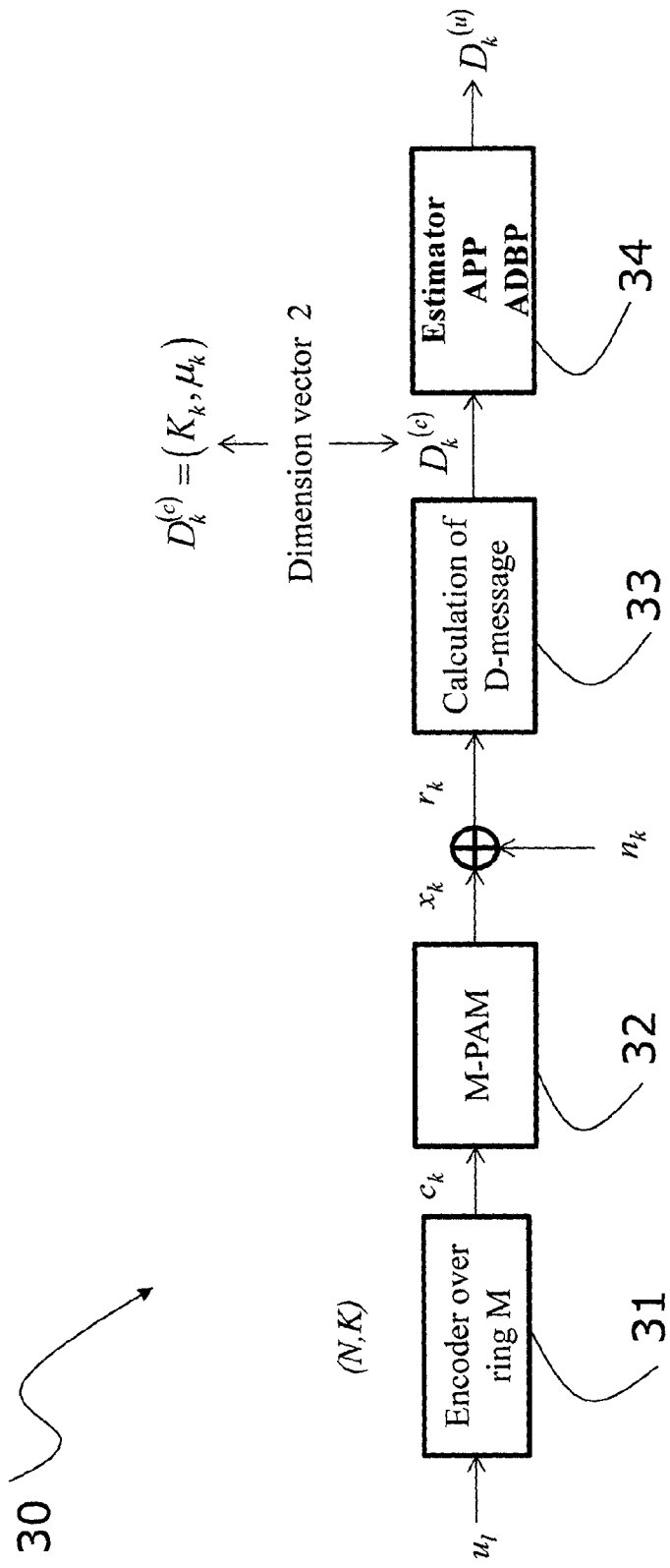
FIG. 10 shows a digital transmission and reception system that implements the method of the present invention.

FIG. 10 illustrates an example of a digital transmission and reception system which advantageously uses the a posteriori probability estimator of the present invention. In particular, FIG. 10 shows a transmission and reception system that employs linear codes over rings with M-PAM modulations and a receiver comprising an a posteriori probability estimator as shown in the third embodiment of the invention.

An encoder 31 with rate K/N over a ring with cardinality M generates blocks of N integer symbols $c_k$ in the interval [0,M−1] starting from blocks of K symbols $u_j$ of the same cardinality. The symbols $c_k$ are transmitted through an M-PAM modulation on an additive Gaussian channel by means of the correspondence x(c) that defines the M-PAM type modulator 32.

The task of the receiver is to estimate the symbols transmitted at maximum a posteriori probability (MAP). To do so, it is necessary to calculate the a posteriori probability of the latter and decide for the symbol that maximizes it.

Since the model that describes an encoder over rings is a linear model which only involves repetitions and sums modulo M and the input messages to the estimator 34 are sampled and Gaussian messages, it is possible to use the version that processes D-messages of the third embodiment of the present invention through a processing module 33.

The receiver of FIG. 10, based on the a posteriori probability estimator of the present invention, has a complexity and memory requirements which are independent of M, and hence independent of the spectral efficiency η of the system, unlike prior art receivers, wherein the complexity of the estimator is at least linear with M and therefore exponential with the spectral efficiency of the system.

The method and the estimator according to the present invention may also be used with the method according to the first and second embodiments of the present invention.

The features and advantages of the present invention are apparent from the above description.

The method according to the present invention advantageously introduces a new family of methods of propagation of messages for discrete and/or wrapped variables.

The method for updating a factor graph of an a posteriori probability estimator according to the present invention advantageously requires a quantity of memory for message representation which is constant and independent of the cardinality of the variables' alphabets in use.

Another advantage is that the method of the present invention allows acting upon messages wherein variables are limited and/or discrete.

A further advantage is that the method of the present invention allows creating iterative decoders for non-binary codes with high or very high cardinality.

Finally, the method of the present invention can advantageously be used for at least the following applications:
- generation of iterative decoding algorithms for telecommunications channel codes (LDPC, turbo codes and the like);
- MIMO receivers, source coding and receivers for digital telecommunications;
- artificial intelligence and neural networks;
- optimization and modelling;
- any application using BP algorithms on linear systems also involving discrete and/or finite support variables and sums modulo M.

The method for updating a factor graph of an a posteriori probability estimator described herein by way of example may be subject to many possible variations without departing from the novelty spirit of the inventive idea; it is also clear that in the practical implementation of the invention the illustrated details may have different shapes or be replaced with other technically equivalent elements.

It can therefore be easily understood that the present invention is not limited to a method for updating a factor graph of an a posteriori probability estimator, but may be subject to many modifications, improvements or replacements of equivalent parts and elements without departing from the inventive idea, as clearly specified in the following claims.

The invention claimed is:

1. A computer-implemented method for updating a factor graph of an a posteriori probability estimator which reduces computing complexity and reduces memory requirements, said factor graph comprising at least one repetition node and at least one sum node, wherein at least two connections are associated with each node, and wherein each connection is associated with an incoming message at said node and with an outgoing message from said node; said method comprising:

a) storing the nodes' incoming and outgoing messages into memory of said estimator as messages belonging to one same class of wrapped Gaussian messages, wherein the messages are represented with two parameters including a mean μ and a concentration K of the corresponding wrapped Gaussian distribution;

b) updating said node of said factor graph by using a resulting message belonging to said class of incoming messages, said resulting message being obtained by processing said incoming wrapped Gaussian messages; wherein said wrapped Gaussian distribution describes a random variable which takes values in a finite range and is parametrized as follows:

$$W(\mu, K, x) = \sum_{i=-\infty}^{\infty} e^{-\frac{K}{2}(x-iM-\mu)^2}, x \in [0, M]$$

and wherein a wrapping period is M,
wherein when said node is a repetition node, corresponding to the multiplication of the distributions, the processing of the resulting message varies depending on the concentration parameter of said incoming wrapped Gaussian messages as follows:
when the concentration is larger than a threshold said resulting message has a mean of $$\bar{\mu}_3 = \frac{\bar{\mu}_1 K_1 + \bar{\mu}_2 K_2}{K_1 + K_2}$$

mod M and a concentration of $K_3 = K_1 + K_2$, where $\bar{\mu}_1$ and $K_1$ are, respectively, the means and the concentration of a first incoming wrapped Gaussian message at said repetition node, $\bar{\mu}_2$ and $K_2$ are, respectively, the mean and the concentration of a second incoming wrapped Gaussian message at said repetition node, and M is the wrapping period of said incoming wrapped Gaussian messages, and wherein said means $\bar{\mu}_1$ and $\bar{\mu}_2$ are chosen among all possible values of $\bar{\mu}_1 = \mu_1 + k_1 M$ and $\bar{\mu}_1 = \mu_2 + k_2 M$ so that $|\bar{\mu}_1 - \bar{\mu}_2|$ is minimum, and
when the concentration is smaller than said threshold, the resulting message has a mean $\mu_3$ of $$\frac{1}{A}\arctan\left(\frac{K_{v,1}\sin(A\mu_1) + K_{v,2}\sin(A\mu_2)}{K_{v,1}\cos(A\mu_1) + K_{v,2}\cos(A\mu_2)}\right)$$

and a concentration $K_{w,3}$ of $A^2 f(\sqrt{K_{v,1}^2 + K_{v,2}^2 + 2K_{v,1}K_{v,2}\cos(A(\mu_1-\mu_2))})$, where $$K_{v,i} \triangleq f^{-1}(K_{w,i}/A^2)$$
$$i = 1, 2$$
$$A \triangleq \frac{2\pi}{M},$$

wherein when said node is a sum node, corresponding to a convolution of the distributions, said resulting message has a mean which is the sum of the means of a first and a second incoming wrapped Gaussian messages $\mu_3 = \mu_1 + \mu_2$, and the concentration is $(K_1^{-1} + K_2^{-1})$, where $K_1$ is a concentration of said first incoming wrapped Gaussian message and $K_2$ is a concentration of said second incoming wrapped Gaussian message.

2. The method according to claim 1, wherein said message class of said nodes' incoming and outgoing messages comprises the sampled and wrapped Gaussian messages, wherein the wrapping period M is an integer, and wherein said sampled and wrapped Gaussian distribution describes a random variable which takes only integer values in a finite range and is parametrized as follows $$WG(\mu, K) = \sum_{j=-\infty}^{\infty} e^{-\frac{K}{2}(i-jM-\mu)^2}, i \in [0, 1, \ldots M-1].$$

3. A computer-implemented method for updating a factor graph of an a posteriori probability estimator which reduces computing complexity and reduces memory requirements, said factor graph comprising at least one repetition node and at least one sum node, wherein at least two connections are associated with each node, and wherein each connection is associated with an incoming message at said node and with an outgoing message from said node; said method comprising:
a) storing the nodes' incoming and outgoing messages into memory of said estimator as messages belonging to one same class of sampled Gaussian messages, represented with a mean and a concentration of a corresponding sampled Gaussian distribution;
b) updating said nodes of said factor graph by using a resulting message belonging to said same class of incoming sampled Gaussian messages, said resulting message being obtained by processing said incoming sampled Gaussian messages;
wherein said sampled Gaussian distribution describes a random variable which takes only integer values and is parametrized as follows $$G(\mu, K) = e^{-\frac{K}{2}(i-\mu)^2} i \in Z,$$

wherein:
when said node is a repetition node said resulting message has a mean of $$\frac{\mu_1 K_1 + \mu_2 K_2}{K_1 + K_2}$$

and a concentration of $K_1 + K_2$, where $\mu_1$ and $K_1$ are, respectively, a mean and a concentration of a first incoming sampled Gaussian message, and $\mu_2$ and $K_2$ are, respectively, a mean and a concentration of a second incoming sampled Gaussian message,
when said node is a sum node the updating of the resulting message varies depending on the concentration parameter of said incoming sampled Gaussian messages, wherein:
when the concentration is smaller than a threshold said resulting message has a mean which is the sum of the means of a first and a second incoming sampled Gaussian messages, and the concentration is $(K_1^{-1} + K_2^{-1})^{-1}$, wherein $K_1$ is the concentration of said first incoming sampled Gaussian message and $K_2$ is the concentration of said second incoming sampled Gaussian message, and
when the concentration is larger than said threshold said resulting message has a mean of $\mu_3$ and a concentration of $K_{w,3}$, obtainable from the following formulas:

$$K_{v,i} = f^{-1}(1/K_{w,i})$$
$$\mu_i = (l_i + \alpha_i)$$

-continued $$\gamma_i = \alpha_i K_{w,i}$$

$$\gamma_3 = \frac{1}{2}\log\frac{K_{v,1}e^{\gamma_1} - K_{v,2}e^{\gamma_2}}{K_{v,1}e^{-\gamma_1} - K_{v,2}e^{-\gamma_2}}$$

$$l_3 = l_1 + l_2$$

$$K_{w,3} = 1\big/f\left(\sqrt{K_{v,1}^2 + K_{v,1}^2 + 2K_{v,2}K_{v,2}\cosh(\gamma_1 - \gamma_2)}\right)$$

where $\mu_1$ and $K_1$ are, respectively, a mean and a concentration of a first incoming sampled Gaussian message at said sum node, and $\mu_2$ and $K_2$ are, respectively, a mean and a concentration of a second incoming sampled Gaussian message at said sum node.

4. The method according to claim 3, wherein said node is a sum node and said concentration is larger than a threshold, wherein said resulting message has a mean of $\mu_3$ and a concentration of $K_{w,3}$, obtainable from the following formulas:

$$\kappa_{v,i} = -K_{w,i}/2$$

$$\mu_i = (l_i + \alpha_i)$$

$$\gamma_i = \alpha_i K_{w,i}$$

$$K_{w,3} = -\max^*(2\kappa_{v,1}, 2\kappa_{v,1}, \kappa_{v,1} + \kappa_{v,2} + \max^*(\gamma_1 - \gamma_2, \gamma_2 - \gamma_1))$$

$$\gamma_3 = \frac{1}{2}(\max^*(\kappa_{v,1} + \gamma_1, \kappa_{v,2} + \gamma_2) - \max^*(\kappa_{v,1} - \gamma_1, \kappa_{v,2} - \gamma_2))$$

where $\mu_1$ and $K_1$ are, respectively, the mean and the concentration of a first incoming sampled Gaussian message at said sum node, and $\mu_2$ and $K_2$ are, respectively, the mean and the concentration of a second incoming sampled Gaussian message at said sum node, and wherein the operator $\max^* \triangleq \log \Sigma \exp$ has been introduced.

5. The method according to claim 3, wherein said message class of said nodes' incoming and outgoing messages comprises the sampled and wrapped Gaussian messages, wherein the wrapping period M is an integer, and wherein said sampled and wrapped Gaussian distribution describes a random variable which takes only integer values in a finite range and is parametrized as follows $$WG(\mu, K) = \sum_{j=-\infty}^{\infty} e^{-\frac{K}{2}(i-jM-\mu)^2}, i \in [0, 1, \ldots M-1].$$

6. The method according to claim 4, wherein said message class of said nodes' incoming and outgoing messages comprises the sampled and wrapped Gaussian messages, wherein the wrapping period M is an integer, and wherein said sampled and wrapped Gaussian distribution describes a random variable which takes only integer values in a finite range and is parametrized as follows $$WG(\mu, K) = \sum_{j=-\infty}^{\infty} e^{-\frac{K}{2}(i-jM-\mu)^2}, i \in [0, 1, \ldots M-1].$$

7. A system for updating a factor graph of an a posteriori probability estimator which reduces computing complexity and reduces memory requirements, said factor graph comprising at least one repetition node and at least one sum node, wherein at least two connections are associated with each node, and wherein each connection is associated with an incoming message at said node and with an outgoing message from said node, the system comprising:
  one or more computer processors; and
  computer readable memory having stored therein computer executable instructions which, when executed upon the one or more processors, cause the system to be configured to perform:
  a) storing the nodes' incoming and outgoing messages into memory of said estimator as messages belonging to one same class of wrapped Gaussian messages, wherein the messages are represented with two parameters including a mean $\mu$ and a concentration K of the corresponding wrapped Gaussian distribution;
  b) updating said node of said factor graph by using a resulting message belonging to said class of incoming messages, said resulting message being obtained by processing said incoming wrapped Gaussian messages;
  wherein said wrapped Gaussian distribution describes a random variable which takes values in a finite range and is parametrized as follows:

$$W(\mu, K, x) = \sum_{i=-\infty}^{\infty} e^{-\frac{K}{2}(x-iM-\mu)^2}, x \in [0, M]$$

and wherein a wrapping period is M,
wherein when said node is a repetition node, corresponding to the multiplication of the distributions, the processing of the resulting message varies depending on the concentration parameter of said incoming wrapped Gaussian messages as follows:
  when the concentration is larger than a threshold said resulting message has a mean of $$\overline{\mu}_3 = \frac{\overline{\mu}_1 K_1 + \overline{\mu}_2 K_2}{K_1 + K_2}$$

mod M and a concentration of $K_3 = K_1 + K_2$, where $\overline{\mu}_1$ and $K_1$ are, respectively, the means and the concentration of a first incoming wrapped Gaussian message at said repetition node, $\overline{\mu}_2$ and $K_2$ are, respectively, the mean and the concentration of a second incoming wrapped Gaussian message at said repetition node, and M is the wrapping period of said incoming wrapped Gaussian messages, and wherein said means $\overline{\mu}_1$ and $\overline{\mu}_2$ are chosen among all possible values of $\overline{\mu}_1 = \mu_1 + k_1 M$ and $\overline{\mu}_4 = \mu_2 + k_2 M$ so that $|\overline{\mu}_1 - \overline{\mu}_2|$ is minimum, and
  when the concentration is smaller than said threshold, the resulting message has a mean $\mu_3$ of $$\frac{1}{A}\arctan\left(\frac{K_{v,1}\sin(A\mu_1) + K_{v,2}\sin(A\mu_2)}{K_{v,1}\cos(A\mu_1) + K_{v,2}\cos(A\mu_2)}\right)$$

and a concentration $K_{w,3}$ of $A^2 f(\sqrt{K_{v,1}^2 + K_{v,2}^2 + 2K_{v,1}K_{v,2}\cos(A(\mu_1-\mu_2))})$, where $$K_{v,i} \triangleq f^{-1}(K_{w,i}/A^2)$$

-continued $$i = 1, 2$$

$$A \triangleq \frac{2\pi}{M},$$

wherein when said node is a sum node, corresponding to a convolution of the distributions, said resulting message has a mean which is the sum of the means of a first and a second incoming wrapped Gaussian messages $\mu_3 = \mu_1 + \mu_2$, and the concentration is $(K_1^{-1} + K_2^{-1})^{-1}$, where $K_1$ is a concentration of said first incoming wrapped Gaussian message and $K_2$ is a concentration of said second incoming wrapped Gaussian message.

8. The system according to claim 7, wherein said message class of said nodes' incoming and outgoing messages comprises the sampled and wrapped Gaussian messages, wherein the wrapping period M is an integer, and wherein said sampled and wrapped Gaussian distribution describes a random variable which takes only integer values in a finite range and is parametrized as follows $$WG(\mu, K) = \sum_{j=-\infty}^{\infty} e^{-\frac{K}{2}(i-jM-\mu)^2}, i \in [0, 1, \ldots M-1].$$

9. A system for updating a factor graph of an a posteriori probability estimator which reduces computing complexity and reduces memory requirements, said factor graph comprising at least one repetition node and at least one sum node, wherein at least two connections are associated with each node, and wherein each connection is associated with an incoming message at said node and with an outgoing message from said node; the system comprising:
   one or more computer processors; and
   computer readable memory having stored therein computer executable instructions which, when executed upon the one or more processors, causes the system to be configured to perform:
   a) storing the nodes' incoming and outgoing messages into memory of said estimator as messages belonging to one same class of sampled Gaussian messages, represented with a mean and a concentration of a corresponding sampled Gaussian distribution;
   b) updating said nodes of said factor graph by using a resulting message belonging to said same class of incoming sampled Gaussian messages, said resulting message being obtained by processing said incoming sampled Gaussian messages;
   wherein said sampled Gaussian distribution describes a random variable which takes only integer values and is parametrized as follows $$G(\mu, K) = e^{-\frac{K}{2}(i-\mu)^2} i \in Z,$$

wherein:
   when said node is a repetition node said resulting message has a mean of $$\frac{\mu_1 K_1 + \mu_2 K_2}{K_1 + K_2}$$

and a concentration of $K_1 + K_2$, where $\mu_1$ and $K_1$ are, respectively, a mean and a concentration of a first incoming sampled Gaussian message, and $\mu_2$ and $K_2$ are, respectively, a mean and a concentration of a second incoming sampled Gaussian message,
   when said node is a sum node the updating of the resulting message varies depending on the concentration parameter of said incoming sampled Gaussian messages,
   wherein:
      when the concentration is smaller than a threshold said resulting message has a mean which is the sum of the means of a first and a second incoming sampled Gaussian messages, and the concentration is $(K_1^{-1} + K_2^{-1})^{-1}$, wherein $K_1$ is the concentration of said first incoming sampled Gaussian message and $K_2$ is the concentration of said second incoming sampled Gaussian message, and
      when the concentration is larger than said threshold said resulting message has a mean of $\mu_3$ and a concentration of $K_{w,3}$, obtainable from the following formulas:

$$K_{v,i} = f^{-1}(1/K_{w,i})$$

$$\mu_i = (l_i + \alpha_i)$$

$$\gamma_i = \alpha_i K_{w,i}$$

$$\gamma_3 = \frac{1}{2} \log \frac{K_{v,1} e^{\gamma_1} - K_{v,2} e^{\gamma_2}}{K_{v,1} e^{-\gamma_1} - K_{v,2} e^{-\gamma_2}}$$

$$l_3 = l_1 + l_2$$

$$K_{w,3} = 1 \Big/ f\left(\sqrt{K_{v,1}^2 + K_{v,1}^2 + 2K_{v,2} K_{v,2} \cosh(\gamma_1 - \gamma_2)}\right)$$

where $\mu_1$ and $K_1$ are, respectively, a mean and a concentration of a first incoming sampled Gaussian message at said sum node, and $\mu_2$ and $K_2$ are, respectively, a mean and a concentration of a second incoming sampled Gaussian message at said sum node.

10. The system according to claim 9,
   wherein said node is a sum node and said concentration is larger than a threshold, wherein said resulting message has a mean of $\mu_3$ and a concentration of $K_{w,3}$, obtainable from the following formulas:

$$\kappa_{v,i} = -K_{w,i}/2$$

$$\mu_i = (l_i + \alpha_i)$$

$$\gamma_i = \alpha_i K_{w,i}$$

$$K_{w,3} = -\max^*(2\kappa_{v,1}, 2\kappa_{v,1}, \kappa_{v,1} + \kappa_{v,2} + \max^*(\gamma_1 - \gamma_2, \gamma_2 - \gamma_1))$$

$$\gamma_3 = \frac{1}{2}(\max^*(\kappa_{v,1} + \gamma_1, \kappa_{v,2} + \gamma_2) - \max^*(\kappa_{v,1} - \gamma_1, \kappa_{v,2} - \gamma_2))$$

where $\mu_1$ and $K_1$ are, respectively, the mean and the concentration of a first incoming sampled Gaussian message at said sum node, and $\mu_2$ and $K_2$ are, respectively, the mean and the concentration of a second incoming sampled Gaussian message at said sum node, and wherein the operator $\max^* \triangleq \log \Sigma \exp$ has been introduced.

\* \* \* \* \*